United States Patent
Hautala

(10) Patent No.: US 10,109,498 B2
(45) Date of Patent: Oct. 23, 2018

(54) COMPOSITE PATTERNING MASK USING ANGLED ION BEAM DEPOSITION

(71) Applicant: Varian Semiconductor Equipment Associates, Inc., Gloucester, MA (US)

(72) Inventor: John Hautala, Beverly, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/296,782

(22) Filed: Oct. 18, 2016

(65) Prior Publication Data

US 2018/0047583 A1    Feb. 15, 2018

Related U.S. Application Data

(60) Provisional application No. 62/372,388, filed on Aug. 9, 2016.

(51) Int. Cl.

| H01L 21/02 | (2006.01) |
| H01L 21/027 | (2006.01) |
| H01L 21/308 | (2006.01) |
| H01L 21/3105 | (2006.01) |
| H01L 21/3115 | (2006.01) |

(52) U.S. Cl.
CPC .... *H01L 21/31155* (2013.01); *H01L 21/0273* (2013.01); *H01L 21/02362* (2013.01); *H01L 21/3086* (2013.01); *H01L 21/31058* (2013.01)

(58) Field of Classification Search
None
See application file for complete search history.

(56) References Cited

U.S. PATENT DOCUMENTS

| 8,741,723 | B2 | 6/2014 | Chi |
| 9,412,613 | B2 | 8/2016 | Manna et al. |
| 9,455,200 | B2 | 9/2016 | Tsai et al. |
| 2002/0094665 | A1 | 7/2002 | Villa et al. |
| 2006/0011865 | A1* | 1/2006 | Migeon ............... H01J 49/142 250/492.3 |
| 2006/0221510 | A1* | 10/2006 | Parkin ................. B82Y 10/00 360/324.2 |
| 2014/0099792 | A1 | 4/2014 | Bergendahl et al. |

(Continued)

FOREIGN PATENT DOCUMENTS

| KR | 10-0769143 B1 | 10/2007 |
| KR | 10-2010-0025363 A | 3/2010 |

*Primary Examiner* — Jay C Chang

(57) ABSTRACT

A method may include providing an initial mask feature in a mask disposed on a substrate, the initial mask feature comprising a first material, the substrate defining a substrate plane; directing ions as an ion beam to the initial mask feature at a non-zero angle of incidence θ with respect to a perpendicular to the substrate plane, wherein a composite mask feature is formed, the composite mask feature comprising a cap material disposed on the initial mask feature, the cap material comprising the ions; and performing a substrate etch, wherein an etch feature is formed in the substrate, wherein at least a portion of the initial mask feature remains after the substrate etch, wherein the substrate etch etches the first material at a first etch rate and etches the cap material at a second etch rate, the first etch rate being greater than the second etch rate.

19 Claims, 4 Drawing Sheets

(56) References Cited

U.S. PATENT DOCUMENTS

2014/0242341 A1* 8/2014 Albrecht .................. G11B 5/82
　　　　　　　　　　　　　　　　　　　　　428/156
2015/0340593 A1　11/2015 Lu et al.
2016/0064026 A1* 3/2016 Arora .................... G11B 5/855
　　　　　　　　　　　　　　　　　　　　　204/192.34

* cited by examiner

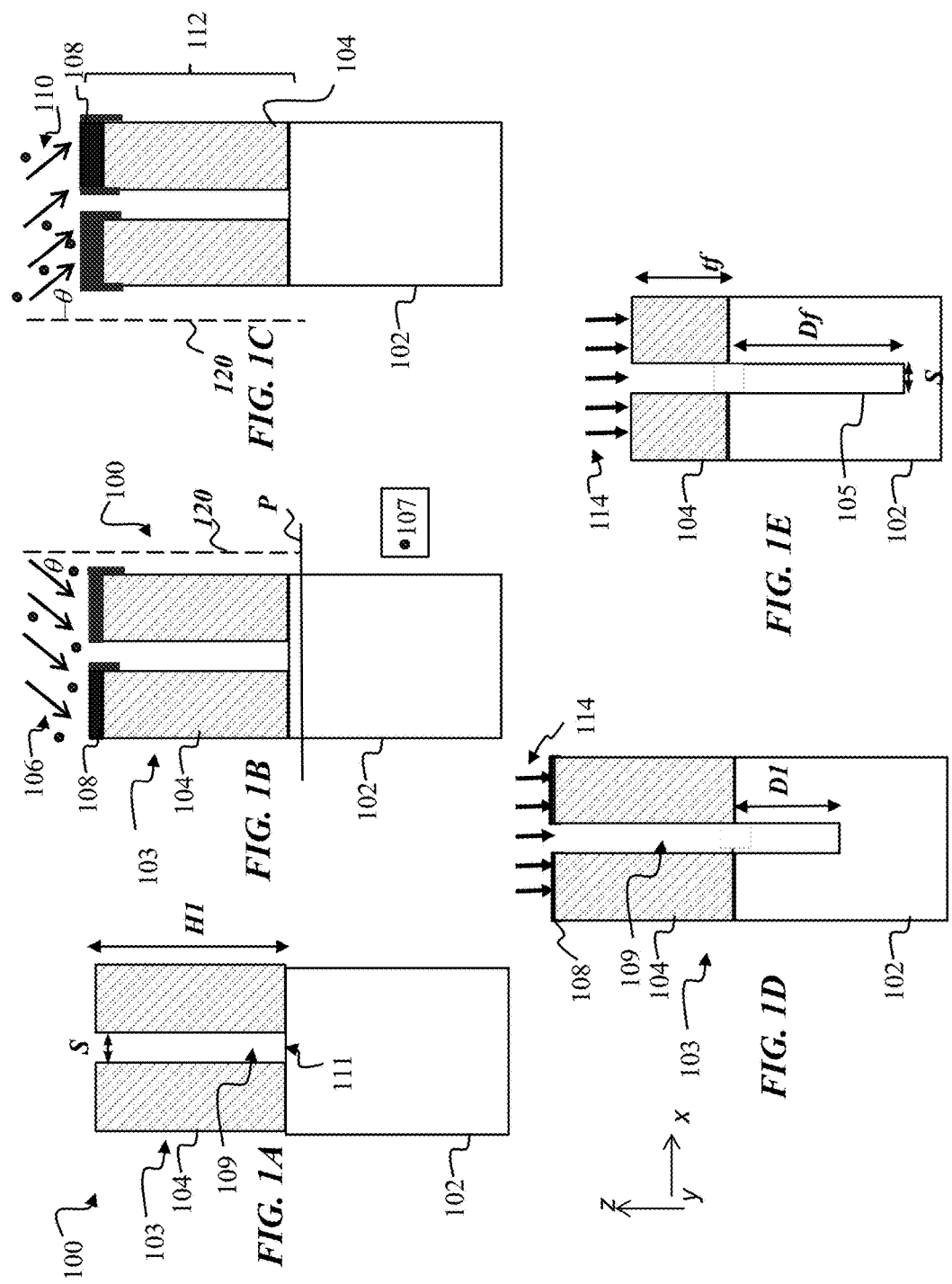

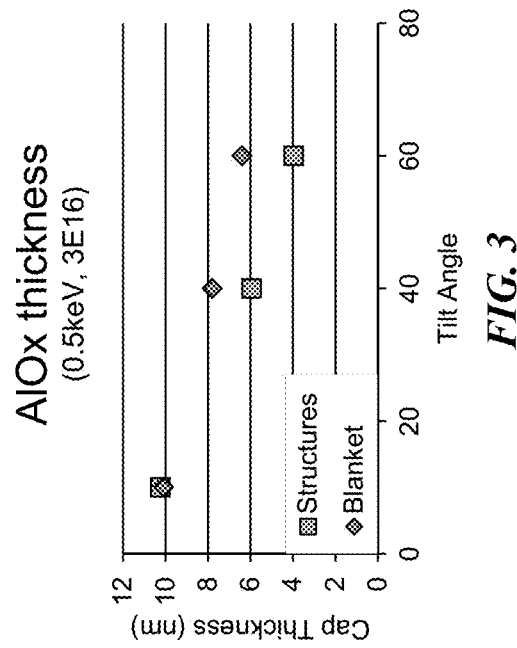
FIG. 3
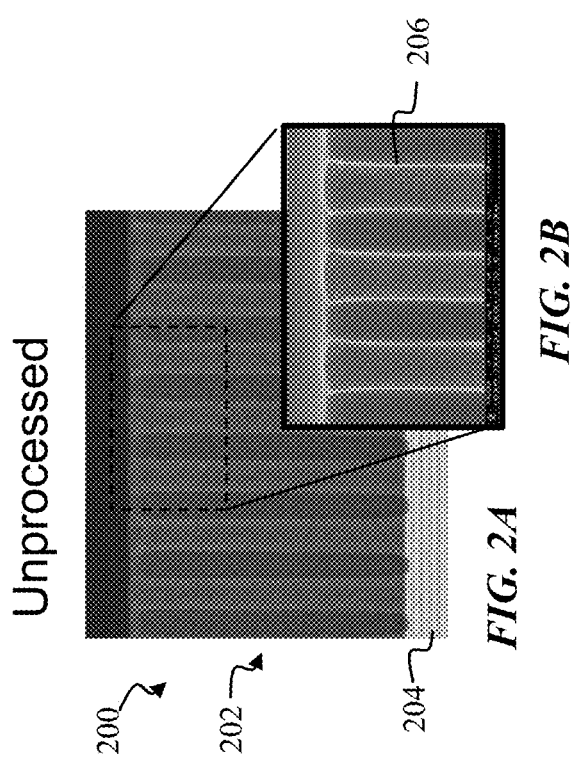
FIG. 2A
FIG. 2B

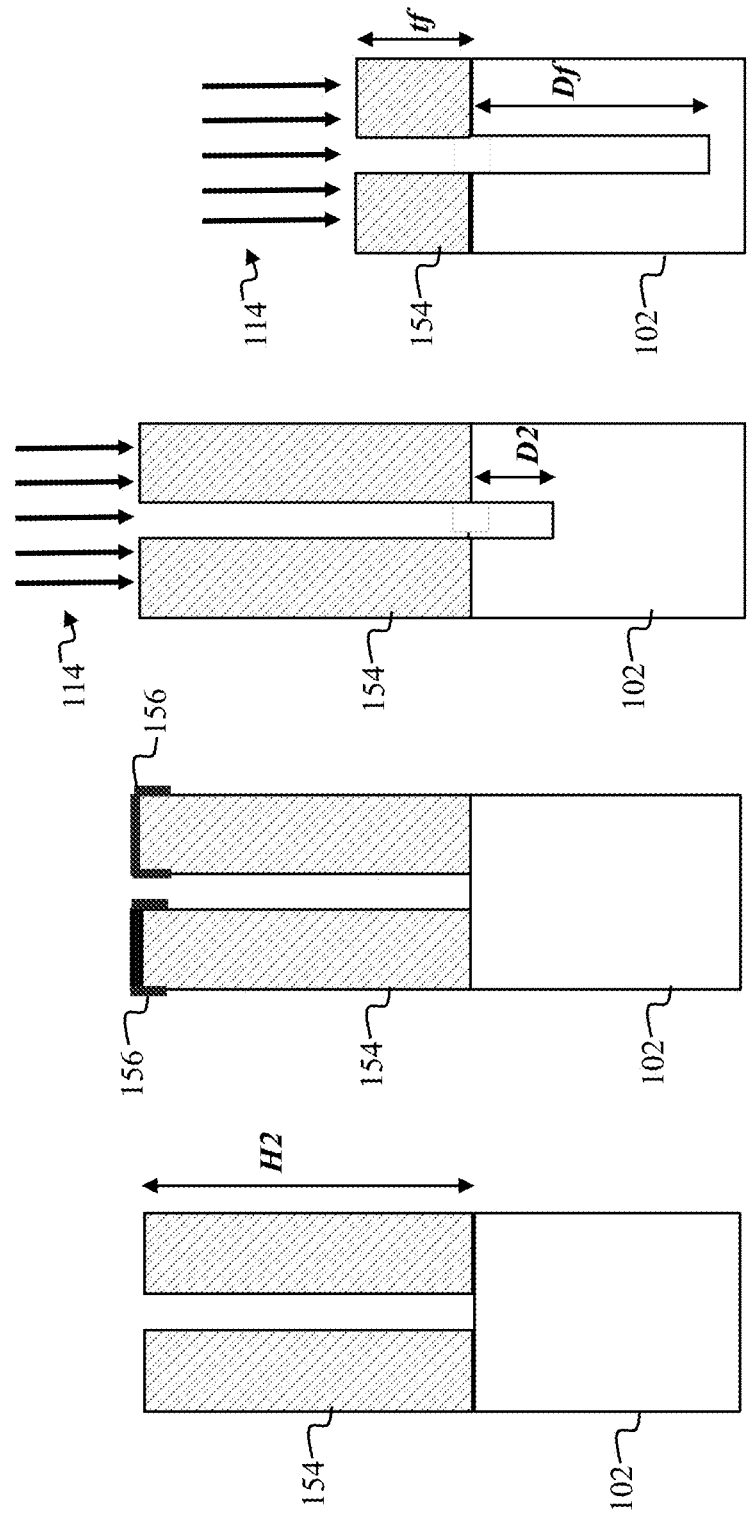

PROVIDING SUBSTRATE DEFINING SUBSTRATE PLANEE
602

FORMING BLANKET LAYER COMPRISING FIRST MATERIAL, BLANKET LAYER ARRANGED ALONG SUBSTRATE PLANE
604

PATTERNING THE BLANKET LAYER TO FORM PLURALITY OF INITIAL MASK FEATURES, WHEREIN PLURALITY OF INITIAL MASK FEATURES COMPRISE FIRST MATERIAL
606

DIRECTING ION BEAM COMPRISING METALLIC SPECIES TO PLURALITY OF INITIAL MASK FEATURES AT NON-ZERO ANGLE OF INCIDENCE (θ) WITH RESPECT TO PERPENDICULAR TO SUBSTRATE PLANE
608

PROVIDING A SUBSTRATE DEFINING SUBSTRATE PLANEE
502

PROVIDING INITIAL MASK FEATURE IN MASK DISPOSED ON SUBSTRATE
504

DIRECTING ION BEAM COMPRISING METALLIC SPECIES TO INITIAL MASK FEATURE AT NON-ZERO ANGLE OF INCIDENCE Θ WITH RESPECT TO PERPENDICULAR TO SUBSTRATE PLANE
506

PERFORMING SUBSTRATE ETCH, WHEREIN ETCH FEATURE IS FORMED IN SUBSTRATE, WHEREIN AT LEAST PORTION OF INITIAL MASK FEATURE REMAINS AFTER SUBSTRATE ETCH
508

COMPOSITE PATTERNING MASK USING ANGLED ION BEAM DEPOSITION

RELATED APPLICATIONS

This application claims priority to U.S. Provisional Patent Application No. 62/372,388, filed Aug. 9, 2016, and incorporated by reference herein in its entirety.

FIELD

The present embodiments relate to substrate patterning techniques, and more particularly, to improved masking systems for patterning the substrates.

BACKGROUND

In the present day as electronic devices and other devices are increasingly scaled to smaller dimensions, techniques for patterning substrates becomes increasingly challenging. For both planar devices such as planar transistor devices, as well as three dimensional devices, such a three dimensional memory devices, deep trenches or other deep structures may be used in the fabrication process. In order to from a deep trench or deep via or similar structure in a substrate, a patterned mask material may be used in portions of the substrate to be protected while etching of the substrate takes place where mask material is absent. The mask material may subsequently be removed once the substrate is etched to a target depth.

Devices such as vertical NAND (VNAND) memory devices ("NAND" refers to a negative- and logic gate) and dynamic random access memory (DRAM) devices may employ trenches or vias having etch depths of more than one micrometer, for example. Because etching of the substrate may also entail etching of the mask material, in order to preserve at least a portion of the mask for the complete etch process, the mask thickness may be similar to the etch depth in some cases. This situation is especially the case for common mask materials based at least in part on carbon. For example, so called hard mask materials having a similar etch rate to the substrate may be employed for etching a trench having a depth on the order of one micrometer. Additionally, the hard mask pattern features may have a high aspect ratio, meaning the height of the mask feature may be greater than the width of the mask feature, at least along one width direction. In some cases, an aspect ratio (height/width) of the mask feature may approach 10:1 or may be greater. A consequence of etch processing using such relatively thick masks may include faceting and clogging of the mask features during etching, bowing of an underlying etch feature in the substrate, or tapering of the etch feature in the substrate. The final patterned trench, via or other structure in the substrate may deviate from a target shape, such as a vertical trench.

Forming a patterned hard mask using a material having a relatively lower etch rate may in principle reduce the total thickness of the hard mask used in an etch process. A drawback is that patterning techniques to form a hard mask are impractical using effective hard mask materials such as $Al_2O_3$, having a very low etch rate for etches used to etch silicon for example.

With respect to these and other considerations the present embodiments are provided.

BRIEF SUMMARY

In one embodiment, a method includes providing an initial mask feature in a mask disposed on a substrate, the initial mask feature comprising a first material, the substrate defining a substrate plane; directing ions as an ion beam to the initial mask feature at a non-zero angle of incidence θ with respect to a perpendicular to the substrate plane, wherein a composite mask feature is formed, the composite mask feature comprising a cap material disposed on the initial mask feature, the cap material comprising the ions; and performing a substrate etch, wherein an etch feature is formed in the substrate, wherein at least a portion of the initial mask feature remains after the substrate etch, wherein the substrate etch etches the first material at a first etch rate and etches the cap material at a second etch rate, the first etch rate being greater than the second etch rate.

In a further embodiment, a method may include forming a sacrificial mask on a substrate, the sacrificial mask comprising a plurality of initial mask features, wherein an initial mask feature of the plurality of initial mask features comprises a first material, wherein the substrate defines a substrate plane; directing ions as an ion beam to the sacrificial mask at a non-zero angle of incidence (θ) with respect to a perpendicular to the substrate plane, wherein a composite sacrificial mask is formed, the composite sacrificial mask comprising a plurality of mask features, wherein a mask feature of the plurality of initial mask features comprises a lower portion comprising the first material and a cap material disposed on the lower portion, the cap material comprising the ions; and performing a substrate etch, wherein a plurality of etch features are formed in the substrate, wherein at least a portion of the sacrificial mask remains after the substrate etch, wherein the substrate etch etches the first material at a first etch rate and etches the cap material at a second etch rate, the first etch rate being greater than the second etch rate.

In another embodiment, a method of forming a mask may include forming a blanket layer comprising a first material, the blanket layer arranged along a substrate plane; patterning the blanket layer to form a plurality of initial mask features, wherein the plurality of initial mask features comprise the first material; and directing ions as an ion beam to the plurality of initial mask features at a non-zero angle of incidence (θ) with respect to a perpendicular to the substrate plane, wherein after the directing the ion beam, the plurality of initial mask features comprise a lower portion comprising the first material; and a cap material disposed on the lower portion, the cap material comprising the ions.

BRIEF DESCRIPTION OF THE DRAWINGS

FIGS. 1A-1E depict one example of processing of a device structure according to various embodiments of the disclosure;

FIGS. 2A-2B depict an exemplary precursor structure useful for forming a patterned device structure according to the present embodiments;

FIG. 3 depicts experimental results for forming mask features according to embodiments of the disclosure;

FIGS. 4A-4D depict another example of processing of a device structure according to embodiments of the disclosure;

FIG. 5 shows an exemplary process flow according to additional embodiments of the disclosure; and FIG. 6 shows an exemplary process flow according to additional embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques to pattern substrates and in particular novel techniques to modify a mask feature disposed on a substrate surface. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, and so forth.

Various embodiments provide a composite mask feature or a composite mask including a plurality of composite mask features. In various embodiments the composite mask may act as a composite sacrificial mask, where the composite sacrificial mask acts as a composite patterning mask to pattern other material or layers in a substrate and where at least a portion of composite sacrificial mask is to be removed during later processing. Additional embodiments provide techniques for forming a composite mask or composite mask feature, as well as techniques for pattering a substrate using the composite mask or composite mask feature. The composite masks of the present embodiments may be used as a composite patterning mask, meaning the composite mask is used to pattern an underlying substrate.

In particular embodiments, a methods are provided for forming structures to pattern a substrate. In one embodiment, a method may include providing an initial mask feature, or a plurality of such features, in a mask disposed on a substrate, where the initial mask feature if formed of a first material. The initial mask feature may be formed of a known mask material, such as a carbon-containing "hard mask," a photoresist, or other material. The method may further include directing an ion beam including a metallic species to the initial mask feature at a non-zero angle of incidence θ with respect to a perpendicular to a substrate plane. In this manner, a composite mask feature may be formed, where the composite mask feature includes a cap material disposed on the initial mask feature. In particular, the cap material may include the metallic species. As such, the composite mask feature may be used as a sacrificial mask, where a portion of the mask may be consumed in subsequent processing to pattern the substrate. For example, in a particular embodiment, a method may further include the operation of performing a substrate etch, wherein an etch feature is formed in the substrate, wherein at least a portion of the initial mask feature remains after the substrate etch.

As detailed below, the composite mask feature may provide several advantages over conventional masks, such as masks formed just one layer or material. Moreover, the present embodiments provide techniques for forming such composite mask features not achieved by known methods.

FIGS. 1A-1E depict one example of processing of a device structure according to various embodiments of the disclosure. Turning now to FIG. 1A, there is shown a device structure 100, including a substrate 102 and a mask 103, where the mask 103 may include at least one initial mask feature, shown as initial mask feature 104. In various embodiments, the substrate 102 may include at least one material, may include multiple layers, and may include multiple features or structures within a layer. In one example, the substrate 102 may be a monocrystalline silicon material, while in other embodiments, the substrate 102 may include a silicon oxide outer layer, may be a multilayer structure, such as alternating layers of silicon nitride and silicon oxide, alternating layers of silicon and silicon oxide, or other combinations of layers.

The initial mask feature 104 may be formed of a known material, such as carbon, and may include other elements as in known hard mask materials. The embodiments are not limited in this context. The material of the initial mask feature 104 may be useful for etching the substrate 102. For example, the mask material of initial mask feature 104 may be used in etch processes for etching layers such as silicon, silicon nitride, silicon oxide, or combinations of those materials. The initial mask feature 104 may have appropriate dimensions along the X-axis, Y-Axis, and Z-axis of the Cartesian coordinate system shown, for purposes of patterning a feature in the substrate 102. In some examples, the initial mask feature 104 may have dimensions on the order of nanometers, tens of nanometers, or hundreds on nanometers in the X-Y plane, and may have dimensions up to a few micrometers in the Z-axis. The embodiments are not limited in this context. The initial mask feature 104 may be formed according to known patterning processes including any combination of lithography and etching. The embodiments are not limited in this context.

In some embodiments, the initial mask feature 104 may be appropriate for reactive ion etching (RIE) of a substrate material such as silicon, silicon dioxide, silicon nitride, or related materials. In a reactive ion etching process, the initial mask feature 104 may be useful to generate an anisotropic etch where etching of the substrate may take place along the Z-axis of the Cartesian coordinate system shown, in preference over etching along the X-axis or Y-axis. As such, a structure may be etched within the substrate 102 having a shape and size determined by the shape, size, and spacing of the initial mask features 104 within the X-Y plane.

One hallmark of the material of initial mask feature 104 is the etch rate of the initial mask feature 104 when etching the substrate 102. In known materials such as carbon-based hard mask materials, the etch rate during RIE etching of the hard mask may be comparable to the etch rate of the substrate 102, such as within a factor of 2 or 3 of the etch rate of the substrate 102. As a consequence, in order to preserve at least a portion (along the Z-axis) of the initial mask feature 104 during the entirety of the etch process, the initial thickness of the initial mask feature 104 may be arranged to account for the target depth to be etched into the substrate 102. While the thickness of initial mask feature 104 may be acceptable for etching shallow features into substrate 102 or for low aspect ratio features, for purposes of stability of the initial mask feature 104 and robustness of etching process to be performed using the initial mask feature 104, the thickness of the initial mask feature 104 may be limited to a certain value, such as one micrometer. While this thickness may be adequate for etching shallow features in the substrate 102, for features where the etch depth into the substrate 102 may exceed one micron, for example, the initial mask feature 104 by itself be insufficient to generate the desired structure within the substrate 102, at least with the fidelity needed for a given process.

In accordance with the embodiment of FIGS. 1A-1E, a composite mask is formed to address the above issues. As shown in FIG. 1B there an operation takes place wherein an ions 106, which ions may include a metallic species, is directed to the initial mask feature 104 at a non-zero angle of incidence, shown as the angle θ, with respect to a normal 120 to a substrate plane P. As an example, the substrate plane P may lie parallel to the X-Y plane, and the initial mask feature 104 may have a sidewall arranged parallel to the Z-direction, defined by a height H1. In addition, in embodiments having a plurality of initial mask features 104, the mask 103 may be defined by a spacing between adjacent features, S.

In various embodiments, the ions 106 may include a metal such as aluminum (Al), tantalum (Ta), tungsten (W), or titanium (Ti). The embodiments are not limited in this context. Because the ions 106 are directed at the angle θ, the ions of ions 106 may by intercepted by certain portions of the initial mask feature 104. In particular, a flux of metallic species composed of ions 106 may impact the top of the initial mask feature 104, and may condense on the initial mask feature 104. In so doing, the ions 106 may generate a cap layer 108 as shown, wherein the cap layer 108 is disposed on the initial mask feature 104. The cap layer 108 may in particular include material from the ions 106, such as Al, Ta, W, or Ti to name a few examples. In some embodiments, the cap layer 108 may be a metallic layer, such as a layer of Ta, W, Ti, or Al.

In other embodiments, the cap layer 108 may be composed of a nitride or an oxide, such as an aluminum oxide, tantalum oxide tantalum nitride, tungsten nitride or titanium nitride, or other metal oxide or metal nitride. The embodiments are not limited in this context. For example, while the ions 106 are directed to the substrate 102, a flux of a reactive species 107, such as oxygen, may be provided to the substrate 102. The flux of reactive species 107, such as oxygen, may be provided by providing a flow of reactive gas into a process chamber (not shown) containing the substrate 102 during exposure to the ions 106. In particular embodiments, reactive oxygen may be provided by a local plasma oxygen source located near the substrate 102.

In some embodiments, the reactive species 107 may be provided merely from background species present in the ambient of a process chamber containing the substrate 102. For example, at $1\times10^{-6}$ Torr pressure, approximately one monolayer of oxygen species present from background "impurities" may impinge upon the substrate 102 every second during the provision of the ions 106. This rate of impingement may be sufficient to form a stoichiometric oxide compound in the cap layer 108, such as $Al_2O_3$ or $Ta_2O_5$ for a range of flux of the ions 106.

According to various embodiments, the ions 106 may be provided as an ion beam in a beamline ion implanter, where the ion beam is generated as a ribbon beam or scanned spot beam, or spot beam. Alternatively, the ions 106 may be provided as an ion beam in a compact ion beam system, such as a system having a plasma chamber disposed adjacent a substrate chamber housing the substrate 102. The embodiments are not limited in this context. The ions 106 may be provided for an adequate duration to form a cap layer 108 to a target thickness. In some embodiments, the cap layer 108 may have a thickness of 5 nm to 50 nm. The embodiments are not limited in this context. In addition, in some embodiments, the height of the initial mask feature 104 may be on the order of several nanometers to tens of nanometers to hundreds of nanometers, to micrometers. As shown in FIGS. 1A-1E, a plurality of mask features is disposed on the substrate 102 including the initial mask feature 104 and at least one additional mask feature, also shown as initial mask feature 104.

The width of the initial mask feature 104 along the X-direction may be on the order of a few nanometers to tens of nanometers while the spacing between adjacent features, that is, between an initial mask feature 104 and its neighbor, may have similar dimensions. The embodiments are not limited in this context.

In various embodiments, the angle θ may range from an angle of 10 degrees to 70 degrees, while the embodiments are not limited in this context. Depending upon the aspect ratio (H1/S) of the space 109 between adjacent features (initial mask feature 104), providing the ions 106 at an angle within this range of angles may ensure the formation of a cap layer 108 in a top region of an initial mask feature 104, while not depositing material from ions 106 at the bottom of the space 109 on the substrate surface 111. To ensure that no unwanted deposition takes place on substrate surface 111, the value of the angle θ may be set wherein the tangent of the angle is less than the aspect ratio defined above, in other words, $\tan(\theta) < H/S$.

While in some embodiments, a cap layer may be grown in just one operation of an ion beam, in other embodiments, a cap layer such as cap layer 108 may be grown in multiple operations. Turning now to FIG. 1C, there is shown a subsequent operation where ions 110 are directed to the substrate 102. In this example, the ions 110 may form at a non-zero angle of incidence, shown as the angle −θ, with respect to the perpendicular 120 to a substrate plane P. The angle −θ may have a same magnitude as angle θ. Providing two different angles having the same magnitude may be accomplished, for example, by rotating the substrate 102 180 degrees about the perpendicular 120 while the ion beam is stationary. The ions 110 may have the same composition as ions 106 in some embodiments. Additionally, the ions 110 may be provided in a similar ambient as the ambient used when ions 106 are directed to the substrate 102.

In various embodiments, angled ions such as the ions 106 and ions 110 may include ions having an ion energy of 100 eV to 2000 eV. This energy range may ensure the ions 106 and ions 110 deposit at or near the surface of an initial mask feature 104 and do not cause excessive damage to the initial mask feature 104. For example, in particular embodiments the ion energy of ions 106 and ions 110 is less than 1000 eV, such as 100 eV to 500 eV. At this ion energy, ion implantation into the initial mask feature 104 may be avoided or substantially avoided, and other damage to the initial mask feature 104 may avoided or substantially reduced. The avoidance of damage to the initial mask feature 104 may accordingly preserve the proper shape and the targeted spacing between adjacent mask features (see composite mask feature 112 of FIG. 1C), so as to preserve the ability to transfer with fidelity the designed shape and size of a feature to be etched into the substrate 102 (see trench 105 in FIG. 1E) using the composite mask features 112 as an etch mask.

In various embodiments, the substrate 102 may be scanned along a second direction during the directing the ion beam, such as along the X-axis, where the second direction is perpendicular to the normal. This scanning may be useful in embodiments where the ions 106 is provided as a ribbon beam whose cross-section is elongated along the Y-axis. In this manner the ions 106 may extend across an entirety of the substrate 102 along the Y-axis, so the substrate 102 may be completely exposed to the ions 106 may scanning the substrate 102 to a sufficient extent along the X-axis.

After the operation of FIG. 1C is completed, a final cap layer, also shown as the cap layer 108, is present on the initial mask feature 104. The cap layer 108 may have a target thickness as noted earlier. The cap layer 108 and initial mask feature 104 may together form a composite mask feature 112. The target thickness for the cap layer 108 may be designed for multiple purposes. Notably, the cap layer 108 may provide much greater resistance to etching during RIE processing as opposed to the material of initial mask feature 104. For instance in some embodiments, the material of cap layer 108 may have a 50 times lower etch rate in a subsequent etch process to be performed as opposed to the material of initial mask feature 104. In particular, tantalum oxide or aluminum oxide may exhibit an etch rate 50 times lower than the etch rate for a carbon based hard mask under certain reactive ion etching conditions. Accordingly, the provision of just 10 nm thickness for cap layer 108 may provide the equivalent of 500 nm of material of initial mask feature 104 in terms of etch resistance. Providing this amount of material for cap layer 108 may accordingly reduce the thickness of the initial mask feature 104 by 500 nm needed to accomplish the same etch process in the substrate 102.

Accordingly, the cap layer 108 may serve the purpose of reducing the height of the composite mask feature 112 as compared to known masks employing just material of initial mask feature 104. Additionally, the provision of cap layer 108 may allow a substrate to be etched to a much deeper depth for the same thickness of initial mask feature 104, such as an extra 500 nm at the cost of just adding a thickness of 10 nm of cap layer 108.

Turning now to FIG. 1D there is shown a subsequent operation wherein a substrate etch is performed to etch the substrate 102 in the presence of the composite mask feature 112. During the etch, ions 114 are directed to the device structure 100. The ions 114 may represent any known reactive etchant, such as a reactive ion etch process, including a known etch composition to etch silicon, silicon nitride, or silicon oxide. For example, a gas composition including $CF_x$ gasses may be employed to generate a reactive ion etching ambient in a plasma chamber that houses the substrate 102 during the operation of FIG. 1D. The embodiments are not limited in this context. As noted, the etch process depicted in FIG. 1D may be highly anisotropic so as to etch the substrate 102 in a vertical direction along the Z-axis while not etching along the X axis or Y axis. As etching proceeds, the substrate 102 may be eroded below the space 109.

In the instance depicted at FIG. 1D, the cap layer 108 may also be eroded to the extent where nearly the entirety of the cap layer 108 has been removed. At this point, the substrate 102 has been etched to a depth D1. For example, the substrate 102 may be etched to a depth of 500 nm while the cap layer 108, initially 10 nm thick, is etched away.

Turning to FIG. 1E there is shown a subsequent instance after the operation of FIG. 1D is continued for a further length of time. In this circumstance the ions 114 have etched further into the substrate 102, to a target depth represented by Df. For example, the target depth may be 75 nm within the substrate 102. This further etching may cause the erosion of a substantial amount of the initial mask feature 104, such as 25 nm, resulting in a final thickness of the initial mask feature 104, represented by tf. If the thickness of initial mask feature 104 before etching was 50 nm, the final thickness may be 25 nm. This final thickness may be an average thickness and may vary, for example in different regions of a wafer being patterned by the mask 103, due to across-wafer variation in deposition and etching processes. Accordingly, providing sufficient thickness for the initial mask feature 104 before etching may be useful to ensure that the material of the mask 103 remains in all portions of a mask covering a macroscopic substrate, such as a substrate having dimensions on the order of several hundred millimeters.

In sum, the operations of FIGS. 1A-1E illustrate an example where the provision of a cap layer 108 enhances the ability to etch deep features into a substrate. Advantageously, the use of an angled ion beam to form a cap layer just on the top of a mask feature composed of a known mask material allows the depth of an etch feature in a substrate to be increased without adding substantially to mask height. Alternatively, for a target depth to be etched into a substrate, the thickness of the initial mask layer composed of known mask material provided before etching may be reduced substantially by the addition of the cap material. Because, the cap material is provided in an operation where ions deposit a non-zero angle with respect to a normal to the substrate, the deposition of any cap material on exposed portions of the substrate to be etched in a subsequent etching operation is prevented. This prevention of unwanted deposition allows the subsequent etch operation to be conducted without the etching species encountering the same etch-resistant material of the cap layer in the substrate regions where etching is desired. In particular embodiments, for example, the reactive etchant etches the initial mask material at a first etch rate and etches the cap material at a second etch rate, where the first etch rate is at least five times greater than the second etch rate. Therefore, the provision of even a relatively smaller thickness of the cap material may have the same effect in terms of etch resistance to the reactive etchant, as a much greater thickness of the initial mask material.

Notably, known techniques used for altering mask material to modify mask properties relying on plasma techniques may not be able to selectively generate a cap layer just on upper regions of a mask as in the present embodiments.

FIGS. 2A-2B depict an exemplary precursor structure useful for forming a patterned device structure according to the present embodiments. In this example, FIG. 2A depicts a device structure 200, where the device structure 200 includes a mask 202 disposed on a substrate 204. The mask is a carbon based mask having a thickness of approximately 1 micrometer. The substrate 204 is a multilayer material to be etched using the mask 202. FIG. 2B shows a close-up of mask 202, illustrating details of a mask feature 206.

FIG. 3 depicts experimental results for forming mask features according to embodiments of the disclosure. In the graph shown in FIG. 3 results are shown for angled ion deposition on a mask similar to the mask 202 of FIG. 2A, as well as for deposition on a blanket substrate. The angled ion deposition was performed using a beamline ion implanter to direct a dose of $3E16/cm^2$ of 500 eV aluminum ions to a substrate at different values for the angle θ, as defined above. As illustrated, at 10 degrees a 10 nm thick aluminum oxide cap layer is formed. The thickness of the cap layer decreases as the angle of incidence is increased to 40 degrees and to 60 degrees, as shown, with a greater decrease for patterned mask features (structures) as opposed to deposition on blanket surfaces.

While the use of $3E16/cm^2$ dose of oxygen for forming a cap layer on a mask feature, such as a carbon mask, may provide the ability to reduce the mask thickness for a carbon mask to a large extent, such as up to 500 nm for a 10 nm cap layer, for example, the duration required to generate such a feature may be a consideration. Alternatively, fabrication of a thinner cap layer may provide for a more rapid process, while still providing substantial reduction in mask thickness.

FIGS. 4A-4D depict another example of processing of a device structure according to embodiments of the disclosure. In this embodiment, the processing operations depicted may be similar to those as described with respect to FIG. 1A-1E above. In this example, as shown in FIG. 4A, the height of an initial mask feature 154 is shown as H2, where this height may be greater than H1. The initial mask feature 154 may be composed of the same material as initial mask feature 104. For example, while H1 may be 50 nm, H2 may be 75 nm. At the instance shown in FIG. 4B, a cap layer 156 has been formed. The cap layer 156 may be formed according to the operations shown in FIG. 1B and FIG. 1C, with a modification wherein the total thickness of the cap layer 156 is reduced with respect to cap layer 108. Subsequently, as shown in FIG. 4C, etching of the substrate 102 may be performed using ions 114. In this example, the entire cap layer 156 has been removed, where the substrate has been etched to a depth D2. The depth D2 may be, for example, 25 nm in comparison to the 50 nm in the example of D1. Subsequently, as shown in FIG. 4D, the substrate 102 is etched to a target depth Df, which depth may be 75 nm as in an example described above with respect to FIG. 1E. Similarly, the final thickness, tf, for the initial mask feature 154 may be 25 nm after the etching process to remove the additional 50 nm of substrate 102 between the instance in FIG. 4C and FIG. 4D.

An advantage of the embodiment of FIGS. 4A-4D is the lesser time required to generate the cap layer 156 as compared to time to generate the cap layer 108, given the same material. A tradeoff is the greater thickness of initial mask feature 154 used to ensure sufficient mask material remain throughout etching. Following along this example, in the extreme case where no cap layer is employed, in order to generate a target etch depth of 75 nm, the thickness of an initial mask feature composed of the same material as in FIG. 1A or FIG. 4A may be 100 nm, in order to ensure sufficient material remains during etching. In some cases, the provision of a relatively thick cap layer may be useful to achieve an etch depth in a substrate not otherwise achievable by the use of a mask composed of just the material of the initial mask layer, such as carbon. Accordingly, the extra duration for forming a cap material may be justified for achieving a superior device structure.

Thus, the amount of cap layer deposited on an initial mask feature may be tailored according to considerations including the limit on the thickness of a mask, the target depth to be etched in a substrate, as well as the processing time and expense for forming the initial cap layer.

In various additional embodiments, before an angled deposition of a cap layer is performed, ions may be directed at a mask including initial mask features as described above in order to treat those features to generate a target final profile of a composite mask. This treatment may involve using a shaping ion beam for shaping top portions of an initial mask feature by etching to create a chamfered shape, a reentrant shape, or other shape, before deposition of the cap layer.

FIG. 5 shows an exemplary process flow 500 according to additional embodiments of the disclosure. At block 502 a substrate is provided where the substrate defines a substrate plane. At block 504 an initial mask feature is provided in a mask disposed on the substrate. The initial mask feature may be defined by known lithographic processes. At block 506 an ion beam comprising metallic species is directed to the initial mask feature at a non-zero angle of incidence with respect to a normal to the substrate plane. The ion beam may be directed for a sufficient duration to generate a composite mask that includes a cap layer having a target thickness on a top portion of the initial mask feature. In some embodiments, the non-zero angle of incidence (θ) may be provided to a mask having a plurality of mask features defined by a feature height H and defined by a feature spacing S, where $\tan(\theta) < H/S$.

At block 508, a substrate etch is performed, wherein an etch feature is formed in the substrate, wherein at least a portion of the initial mask feature remains after the substrate etch. The substrate etch may be performed using a known RIE process in some examples. The substrate etch may remove a portion of the cap layer, may entirely remove the cap layer, or may remove a portion of the initial mask feature.

FIG. 6 shows an exemplary process flow 600 according to additional embodiments of the disclosure. At block 602 a substrate is provided, where the substrate defines a substrate plane. At block 604 a blanket layer is formed, where the blanket is formed on the substrate and arranged along the substrate plane. At block 606 the blanket layer is patterned to form a mask, where the mask includes a plurality of initial mask features. The mask may be formed of a first material, such as a carbon-containing "hard mask" material, a photoresist, or other material. At block 608 an ion beam comprising a metallic species is directed to the plurality of initial mask features at a non-zero angle of incidence with respect to the perpendicular. In some embodiments, the metallic species may be aluminum, tantalum, tungsten or titanium. The embodiments are not limited in this context. The metallic species may provide an adequate dose to form a cap layer on the first material, where the cap layer includes the metallic species.

The present embodiments also provide the advantage of reducing the overall mask thickness used for etching a given depth into a substrate. Another advantage of the present embodiments is the ability to etch deeper features into a substrate than is provided with known mask structures.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing an initial mask feature in a mask disposed on a substrate, the initial mask feature comprising a first material, the substrate defining a substrate plane;
directing ion as an ion beam to the initial mask feature at a non-zero angle of incidence θ with respect to a normal to the substrate plane, wherein a composite mask feature is formed, the composite mask feature comprising a cap material disposed on the initial mask feature, the cap material comprising the ions; and
performing a substrate etch, wherein an etch feature is formed in the substrate, wherein at least a portion of the initial mask feature remains after the substrate etch, wherein the cap material is completely removed before completion of the substrate etch, and wherein the substrate etch etches the first material at a first etch rate and etches the cap material at a second etch rate, the first etch rate being greater than the second etch rate.

2. The method of claim 1, wherein the initial mask feature comprises carbon.

3. The method of claim 1, wherein the cap material comprises Al, Ta, W, Ti, aluminum oxide, tantalum oxide, aluminum nitride, tantalum nitride, tungsten nitride or titanium nitride.

4. The method of claim 1, wherein θ comprises an angle of 10 degrees to 70 degrees.

5. The method of claim 1, further comprising providing a flux of reactive species to the substrate during the directing the ion beam.

6. The method of claim 1, wherein the performing the substrate etch comprises directing a reactive etchant to the substrate, the first etch rate being at least five times greater than the second etch rate.

7. The method of claim 1, further comprising scanning the substrate along a second direction during the directing the ion beam, the second direction being perpendicular to the normal.

8. The method of claim 1, wherein the directing the ion beam comprises providing a first flux of metallic species to the substrate, the method further comprising providing a second flux of reactive species to the substrate during the directing the ion beam, wherein the cap material comprises an oxide formed from the metallic species or a nitride formed from the metallic species.

9. The method of claim 1, wherein the directing the ion beam comprises:
directing the ion beam to the substrate in a first exposure comprising a first dose of a metallic species when the substrate is in a first position;
rotating the substrate about the normal from the first position to a second position; and
directing the ion beam to the substrate in a second exposure comprising a second dose of the metallic species when the substrate is in the second position.

10. The method of claim 1, further comprising, before the directing the ion beam, directing a shaping ion beam to the initial mask feature, wherein a top region of the initial mask feature is altered before the cap material is formed.

11. The method of claim 1, wherein the ion beam comprises ions having an ion energy of 100 eV to 2000 eV.

12. The method of claim 1, wherein the cap material comprises a cap layer having a thickness of 5 nm to 50 nm.

13. The method of claim 1, wherein the mask comprises a plurality of mask features including the initial mask feature and at least one additional mask feature, wherein the plurality of mask features comprises a feature height H and define a feature spacing S, wherein tan (θ)<H/S.

14. A method of patterning a substrate, comprising:
forming a sacrificial mask on a substrate, the sacrificial mask comprising a plurality of initial mask features, wherein an initial mask feature of the plurality of initial mask features comprises a first material, wherein the substrate defines a substrate plane;
directing ions as an ion beam to the sacrificial mask at a non-zero angle of incidence (θ) with respect to a perpendicular to the substrate plane, wherein a composite sacrificial mask is formed, the composite sacrificial mask comprising a plurality of mask features, wherein a mask feature of the plurality of initial mask features comprises a lower portion comprising the first material and a cap material disposed on the lower portion, the cap material comprising the ions; and
performing a substrate etch, wherein a plurality of etch features are formed in the substrate, wherein at least a portion of the sacrificial mask remains after the substrate etch, wherein the cap material is completely removed before completion of the substrate etch, and wherein the substrate etch etches the first material at a first etch rate and etches the cap material at a second etch rate, the first etch rate being greater than the second etch rate.

15. The method of claim 14, wherein the plurality of mask features comprises a feature height H and define a feature spacing S, wherein tan (θ)<H/S.

16. The method of claim 14, further wherein the directing the ion beam comprises providing a first flux of metallic species to the substrate, the method further comprising providing a second flux of reactive species to the substrate during the directing the ion beam, wherein the cap material comprises a metal oxide or a metal nitride, the metal oxide and metal nitride being formed from the metallic species.

17. A method of patterning a substrate, comprising:
forming a blanket layer comprising a first material, the blanket layer arranged along a substrate plane;
patterning the blanket layer to form a plurality of initial mask features, wherein the plurality of initial mask features comprises the first material;
directing ions as an ion beam to the plurality of initial mask features at a non-zero angle of incidence (θ) with respect to a perpendicular to the substrate plane, wherein after the directing the ion beam, the plurality of initial mask features comprises:
a lower portion comprising the first material; and
a cap material disposed on the lower portion, the cap material comprising the ions; and
performing a substrate etch, wherein an etch feature is formed in the substrate, wherein at least a portion of the initial mask feature remains after the substrate etch, wherein the cap material is completely removed before completion of the substrate etch, and wherein the substrate etch etches the first material at a first etch rate and etches the cap material at a second etch rate, the first etch rate being greater than the second etch rate.

18. The method of claim 17, wherein the plurality of mask features comprises a feature height H and define a feature spacing S, wherein tan (θ)<H/S.

19. The method of claim 17, wherein the ions comprise a metallic species.

* * * * *